United States Patent [19]
Akram

[11] Patent Number: 5,936,305
[45] Date of Patent: Aug. 10, 1999

[54] STACKED LEADS-OVER CHIP MULTI-CHIP MODULE

[75] Inventor: Salman Akram, Bosie, Id.

[73] Assignee: Micron Technology, Inc., Boise, Id.

[21] Appl. No.: 09/158,467

[22] Filed: Sep. 22, 1998

Related U.S. Application Data

[62] Division of application No. 08/974,796, Nov. 20, 1997, Pat. No. 5,811,879.

[51] Int. Cl.⁶ .......................... H01L 23/50; H01L 23/12; H01L 26/16
[52] U.S. Cl. .................. 257/723; 257/680; 257/777; 257/778; 257/737; 257/698; 257/679
[58] Field of Search ..................... 257/723, 777, 257/778, 786, 713, 706, 698, 692, 704, 737, 679, 680

[56] References Cited

U.S. PATENT DOCUMENTS

| | | | |
|---|---|---|---|
| 4,649,418 | 3/1987 | Uden | 257/679 |
| 4,725,924 | 2/1988 | Juan | 257/679 |
| 4,731,645 | 3/1988 | Parmentier et al. | 257/679 |
| 4,748,495 | 5/1988 | Kucharek | 257/672 |
| 4,931,853 | 6/1990 | Ohuchi | 257/701 |
| 4,991,000 | 2/1991 | Bone et al. | 257/698 |
| 4,992,849 | 2/1991 | Corbett et al. | 257/669 |
| 4,992,850 | 2/1991 | Corbett et al. | 257/704 |
| 4,996,587 | 2/1991 | Hinrichsmeyer et al. | 257/686 |
| 5,016,138 | 5/1991 | Woodman | 257/712 |
| 5,045,921 | 9/1991 | Lin et al. | 257/780 |
| 5,107,328 | 4/1992 | Kinsman | 257/784 |
| 5,137,836 | 8/1992 | Lam | 437/8 |
| 5,182,632 | 1/1993 | Bechtel et al. | 257/724 |
| 5,239,198 | 8/1993 | Lin et al. | 257/779 |
| 5,255,156 | 10/1993 | Chang | 257/490 |
| 5,280,192 | 1/1994 | Kryzaniwsky | 257/723 |
| 5,280,193 | 1/1994 | Lin et al. | 257/685 |
| 5,418,687 | 5/1995 | Chen | 257/713 |
| 5,438,216 | 8/1995 | Juskey et al. | 257/704 |
| 5,465,470 | 11/1995 | Vongfuangfoo et al. | 29/551 |
| 5,477,067 | 12/1995 | Isomura et al. | 257/903 |
| 5,477,082 | 12/1995 | Buckley, III et al. | 257/723 |
| 5,480,840 | 1/1996 | Barnes et al. | 437/204 |
| 5,495,398 | 2/1996 | Takiar et al. | 257/777 |
| 5,502,289 | 3/1996 | Takiar et al. | 257/777 |

FOREIGN PATENT DOCUMENTS 28 10 054   9/1978   Germany.

*Primary Examiner*—Alexander Oscar Williams
*Attorney, Agent, or Firm*—Trask, Britt & Rossa

[57] ABSTRACT

A multi-chip module (MCM) and method of manufacturing is disclosed that provides for attachment of semiconductor dice to both sides of the MCM printed circuit board (PCB). Semiconductor dice attached to the top surface of the PCB may be attached by conventional wire bonding, TAB or flip chip methods whereas those semiconductor dice attached to the bottom surface of the PCB are wire bonded or TAB connected to the top surface through openings in the PCB. The openings provide a lead-over-chip (LOC) arrangement for those semiconductor dice attached to the bottom surface resulting in shortened wire bonds. The bottom surface of the PCB may be provided with die recesses into which the openings extend, to receive the dice and bring their active surfaces even closer to the top surface of the PCB for wire bonding.

20 Claims, 6 Drawing Sheets

STACKED LEADS-OVER CHIP MULTI-CHIP MODULE

This is a division of application Ser. No. 08/974,796, filed Nov. 20, 1997, now U.S. Pat. No. 5,811,879.

BACKGROUND OF THE INVENTION

1. Field of the Invention

This invention relates generally to multi-chip modules, and more specifically to an LOC module having semiconductor dice attached to both sides of the module. A plurality of apertures formed in the module substrate allows passage of wire bonds from the active surface of the semiconductor dice attached to the bottom surface of the module through the substrate to connections on the top surface of the substrate. In addition, a plurality of chips is attached and electrically connected to the top surface of the substrate.

2. State of the Art

High performance, low cost, increased miniaturization of components, and greater packaging density of integrated circuits have long been the goals of the computer industry. Greater integrated circuit package density, for a given level of component and internal conductor density, is primarily limited by the space available for die mounting and packaging. For lead frame mounted dies, this limitation is, to a great extent, a result of conventional lead frame design.

A leads-over-chip (LOC) integrated circuit (IC) typically includes a semiconductor die (die) electrically attached to an LOC lead frame. In such an arrangement, the lead frame includes a plurality of lead fingers that extend over and are attached to the active surface of the die. The lead fingers are electrically connected to inputs and outputs (I/Os) or bond pads on the active surface and connect the die to external circuitry located on a substrate or other carrier. Moreover, the lead fingers actually provide physical support for the die. The lead frame and die are typically encapsulated within a plastic package, although ceramic and metal packages may also be used depending on the operating environment and the packaging requirements of the die.

With ever increasing demands for miniaturization and higher operating speeds, multi-chip module systems (MCMs) become increasingly attractive in a variety of applications. Generally, MCMs may be designed to include more than one type of die within a single package, or may include multiples of the same die, such as the single in-line memory module (SIMM) or dual in-line memory module (DIMM). MCMs which contain more than one die can help minimize operational speed restrictions imposed by long connection traces between cooperating components by combining, for example, the processor, memory, and associated logic into a single package on a single printed circuit board or other substrate or carrier. In addition, MCMs offer packaging efficiency.

MCMs typically comprise a planar printed circuit board (PCB) or other die carrier substrate to which a plurality of semiconductor dice are attached. Laminated substrates such as FR-4 boards are included in the term PCB as used herein, as are ceramic and silicon substrates, although the latter constructions are at this time less common as MCM carrier substrates. The semiconductor dice are typically wire bonded, TAB-connected or flip chip bonded (by an array of solder or other conductive bumps or conductive epoxies) to the PCB. An MCM configuration typically allows semiconductor dice to be bonded to one side only of the carrier substrate. Moreover, for semiconductor dice that are wire bonded to the PCB, the bond wires extend from the top surface of each die mounted on one side of the PCB by its back side to the plane of the PCB surface on that side, requiring longer wires to be used to connect the dice to the PCB traces than if the active surfaces of the dice were closer to the PCB surface. This often leads to undesirable parasitic electrical characteristics.

Therefore, a need exists for an MCM that provides for increased densification by bonding chips to both sides of the PCB, while providing for shorter wire bonds between wire bonded dice and the MCM PCB.

SUMMARY OF THE INVENTION

Accordingly, the present invention relates to an MCM including a plurality of semiconductor dice attached thereto that is configured for attachment and connection of semiconductor dice to both sides of the PCB. Moreover, all of the semiconductor dice attached to the PCB are electrically connected to the same side of the PCB. This eliminates the added cost for providing dual-sided interconnect traces. This configuration accommodates conventional backside die attach and wirebond connection to the top side of the PCB as well as a flip-chip (face down) direct die attach on the top side of the PCB, in combination with an LOC arrangement with shortened wire bonds for semiconductor dice attached by their active surfaces to the bottom side of the PCB.

More specifically, the PCB has a plurality of slots or openings corresponding to the number of semiconductor dice attached to the bottom side thereof. These slots are smaller in size than the perimeter of the semiconductor dice, such that the PCB extends over at least a portion of the active surface of each die when the dice are attached active surface up to the bottom surface of the PCB. Each bottom semiconductor die includes a plurality of I/Os or bond pads on its active surface in the central region of the active surface of each die. When properly aligned for attachment, the I/Os of the semiconductor die lie within the opening in the PCB defined by the slot. The I/Os of each semiconductor die are subsequently connected (e.g., by wire bonding) to circuit traces located on the top surface of the PCB. The trace ends or bond areas of these traces generally lie near the perimeter of each slot for the shortest practical connection between the connections and I/Os of the die.

In one embodiment, the bottom surface of the PCB is substantially planar with a portion of the active surface of the semiconductor dice adhesively attached thereto. In another embodiment, the PCB includes recessed portions which extend a distance into the bottom surface of the PCB and are sized and shaped to receive a semiconductor die. In this latter embodiment, each recess is aligned with a corresponding slot such that the slot is positioned proximate the center of the recess. When the semiconductor dice are positioned and attached within each recess, the active surface of the die is positioned extremely close to the top surface of the PCB to shorten the length of the wire bond necessary to connect the I/Os to the trace ends on the top surface of the PCB. The depth of each recess may equal or exceed the thickness of the die to be received therein so that the die is fully enclosed in the recess.

The PCB may also include top and bottom walls positioned around the perimeter of the PCB and attached to the top and bottom surfaces of the PCB, respectively. A top lid sized and shaped to fit over the top wall may be attached thereto to completely enclose and seal in the top surface of the PCB and any semiconductor dice attached thereto. Similarly, a bottom lid sized and shaped to fit over the bottom wall may be attached thereto to completely enclose and seal in the bottom surface of the PCB and the attached semiconductor dice. These lids may actually be configured to contact surfaces of the semiconductor dice to provide a heat sink for the dice. In lieu of compartment-type packaging as described above, a glob top of epoxy or silicone may also be utilized to encapsulate each semiconductor die.

Although the MCM of the present invention has been described in relation to several preferred embodiments, a significant aspect of the invention is that the MCM accommodates semiconductor dice on both sides of a PCB or other substrate with those semiconductor dice located on the bottom surface wire bonded to the top surface through openings or slots in the PCB. All electrical connections are therefore made on one side of the PCB.

BRIEF DESCRIPTION OF THE DRAWINGS

The features and advantages of the present invention can be more readily understood with reference to the following description and appended claims when taken in conjunction with the accompanying drawings wherein:

DETAILED DESCRIPTION OF THE ILLUSTRATED EMBODIMENT

Figure 1:
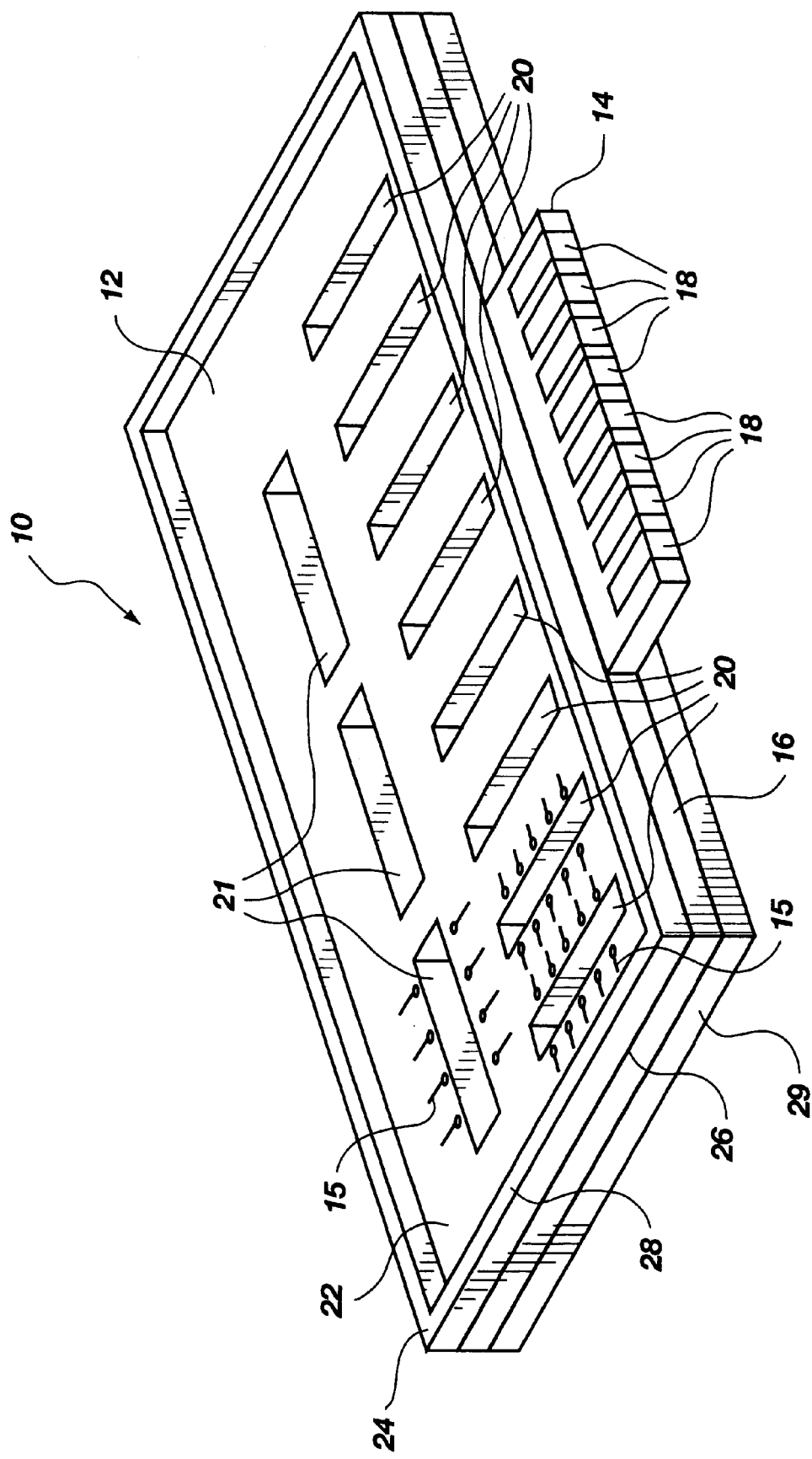
FIG. 1 is a perspective drawing of an MCM PCB in accordance with the present invention.

Referring to FIG. 1 of the drawings, a perspective view of a first embodiment of an LOC MCM 10 according to the present invention is shown. The MCM 10 is generally comprised of a substantially rectangular, substantially planar PCB 12 having a plug-type connection 14 extending from a first side 16. The plug-type connection 14 includes a plurality of electrical connections 18 in communication with the internal circuitry of the PCB 12 and adapted to plug into a receptacle on a mother board, chassis or other carrier as known in the art. The internal circuitry in turn communicates with conductive traces on the exterior of PCB 12, such as exemplary traces 15, through vias or other inter-layer conductors.

The PCB 12, by way of example and not limitation, includes a plurality of transversely extending openings 20 and longitudinally extending openings 21 (with respect to the major horizontal dimension of PCB 12 as shown) that extend through the PCB 12. Openings 20 are illustrated in a substantially parallel mutual relationship while openings 21 are end-to-end or longitudinally aligned, and the two sets of openings 20 and 21 are in a mutually perpendicular arrangement, but it will be understood by those of ordinary skill in the art that openings through PCB 12 may be variously configured, located and aligned depending on the size, shape and bond pad arrangement of the dice and the circuit layout of the PCB 12 required by the function of MCM 10. The size and shape of each opening 20 and 21 may be dependent on the size of the semiconductor die attached thereunder and the configuration of the I/Os or bond pads on the active surface of the die. That is, because the die must be wire bonded through the openings 20 and 21, the I/Os must be accessible through these openings 20 and 21.

Figure 5:
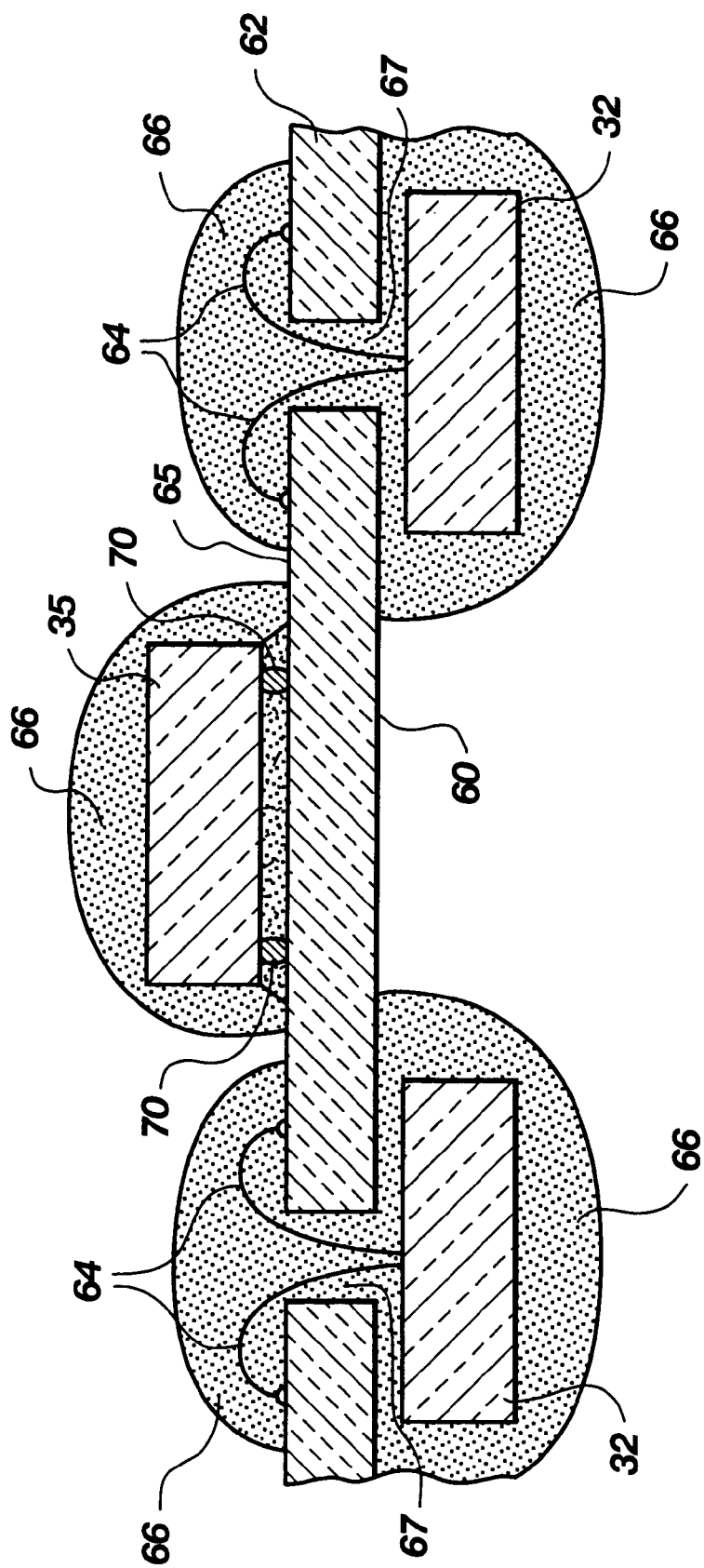
FIG. 5 is a partial, schematic cross-sectional view of a second embodiment of an MCM in accordance with the present invention including a plurality of semiconductor dice that has been encapsulated in a glob top.
Figure 6:
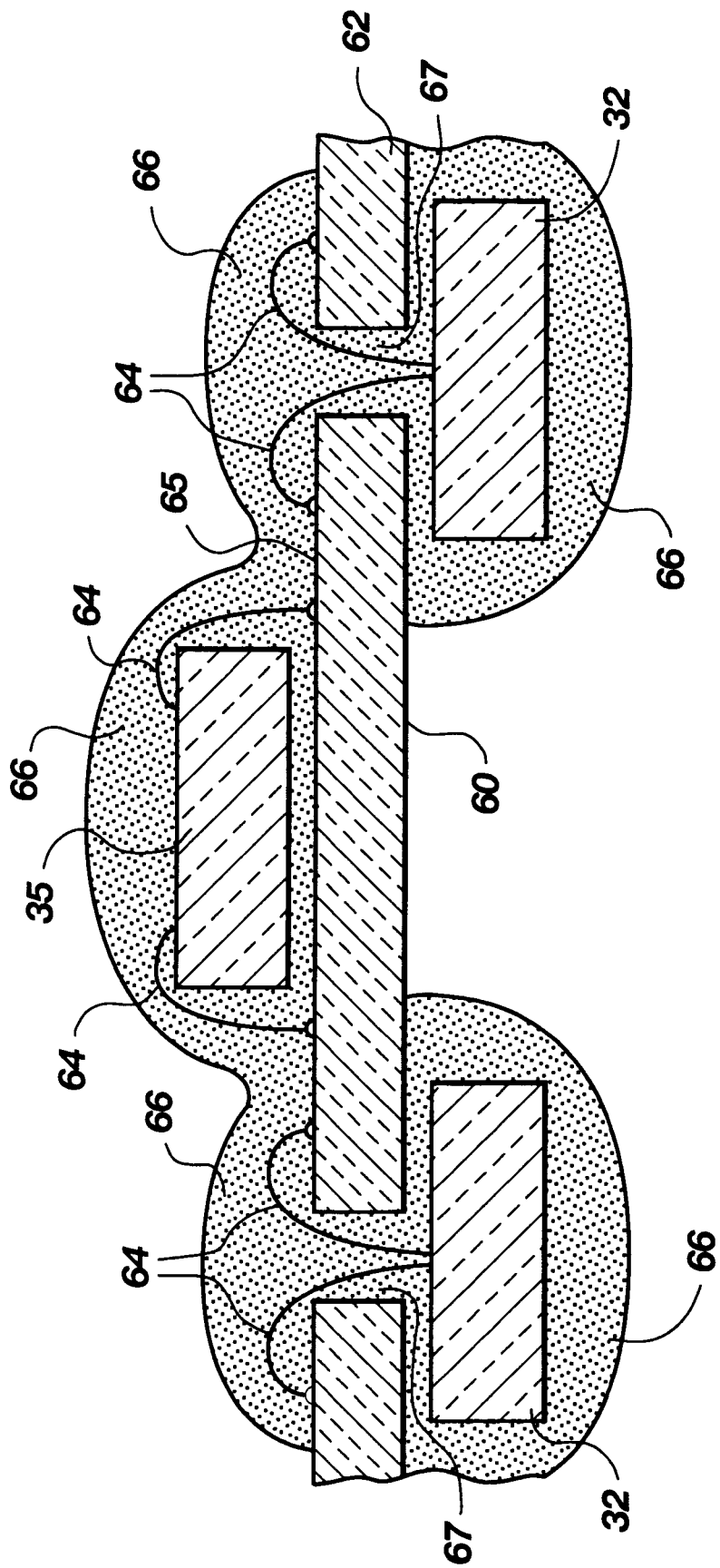
FIG. 6 is a partial, schematic cross-sectional view of a third embodiment of an MCM in accordance with the present invention including a plurality of semiconductor dice that has been encapsulated in a glob top.

Attached to or formed integrally with the top surface 22 of the PCB 12 is a wall 24 that is positioned about the perimeter 26 of the PCB 12. A cover or lid having a similar size and shape as the area defined by the wall 24 may then be attached to the top 28 of the wall 24 to enclose and hermetically seal the components of the MCM 10. A similar wall 29 and lid may also be attached to the bottom surface of the PCB to enclose and seal the bottom of the MCM 10 (see FIG. 4). Of course, walls 24 and 29 may extend about only a portion of the PCB instead of being located at the perimeter, in such case the lid being correspondingly smaller. However, these walls and lids can be completely eliminated by the use of glob top to protect the dice as shown in FIGS. 5 and 6.

Figure 2:
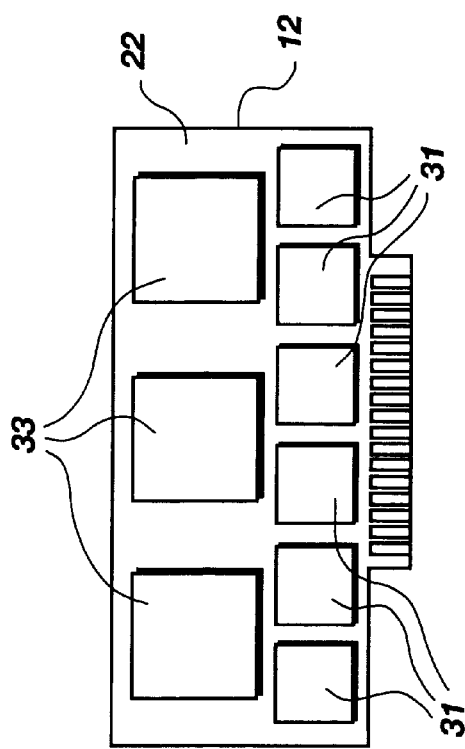
FIG. 2 is a schematic top view of an MCM in accordance with the present invention including a plurality of semiconductor dice flip-chip bonded thereto.

As illustrated in FIG. 2, a plurality of semiconductor dice 31 and 33 of various sizes and types is attached to the top surface 22 of the PCB 12. Wall 24 has been omitted for clarity. The semiconductor dice 31 and 33 are positioned on the top surface 22 such that the openings 20 and 21 are covered by the dice 31 and 33, respectively. In this preferred embodiment, the dice 31 and 33 are flip-chip bonded to the PCB 12, as is known in the art.

Figure 3:
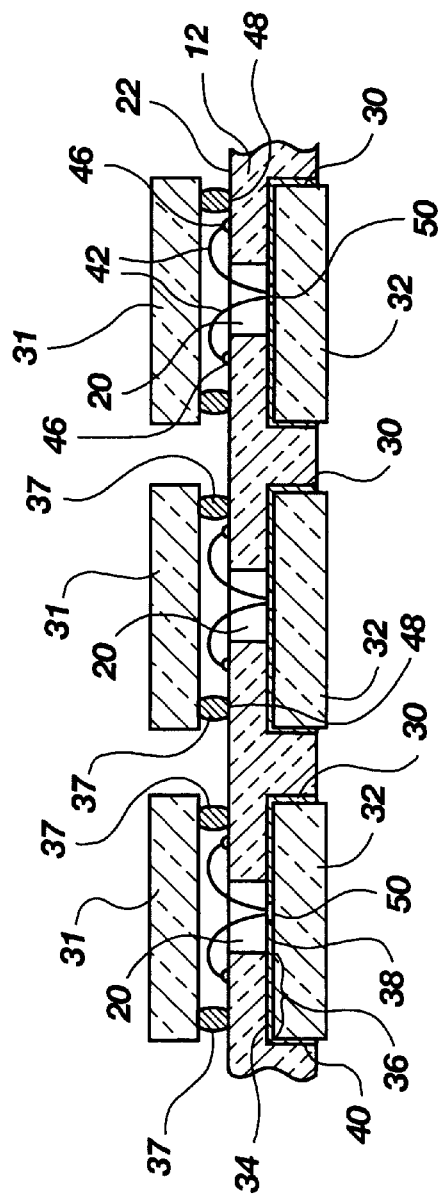
FIG. 3 is a partial, schematic cross-sectional view of a first embodiment of an MCM in accordance with the present invention.

In FIG. 3, a partial cross-sectional view of the PCB 12 is shown. Each opening 20 extends into a recess 30 which is sized and shaped to receive a semiconductor die 32. Each semiconductor die 32 is attached by a layer of adhesive 34 along a portion 36 of its active surface 38 and periphery 40. Adhesive 34 may comprise any suitable dielectric adhesive known in the art, and of any suitable type, including contact adhesives, thermoplastic adhesives and thermosetting adhesives. It is preferred that adhesive 34 be at least tacky at room temperature, and preferably require no cure time. Further, adhesive 34 may comprise a double-sided adhesive tape in lieu of a liquid or gel adhesive. The adhesive, if fluid or gel, may be applied either to the active surfaces of the dice 32 or to the upper surface of the recesses 30 on the underside of PCB 12, or both surfaces. Similarly, if the adhesive structure comprises a double-sided adhesive tape such as a polyimide, it may be first secured to PCB 12 or to dice 32. Generally, with the embodiment of FIG. 3 it will be more convenient to apply the adhesive to the dice active surfaces 38. Many suitable adhesive application methods for liquid or gel adhesive application are known in the art, such as screen printing, roller applicator, spray, transfer, etc. Similarly, an adhesive tape may be applied from a dispenser and severed from a roll of tape, or applied from a transfer (carrier) film.

After affixation to PCE 12, each semiconductor die 32 is then electrically connected by wire bonds 42 of gold, aluminum or other suitable metal or alloy to trace ends or bond areas comprising contacts or pads 46 at the ends of traces 15 on the top surface 22 of the PCB 12. Moreover, because each semiconductor die 32 is positioned in a recess 30, the active surfaces 38 of the semiconductor dice 32 are located closer to the top surface 22 of the PCB 12 than if recesses 30 were not employed, resulting in a shorter length of wire necessary to properly form each wire bond 42 between bond pads 46 and bond pads 50 of dice 32.

After the semiconductor dice 32 have been wire bonded to the PCB 12, a plurality of dice 31 can be subsequently flip-chip bonded to the top surface 22 of the PCB 12. The dice 31 are flip-chip bonded by a plurality of solder or other conductive ball or bump connections 37, as is known in the art, to other trace pads 48 on the top surface 22 of the PCB 12. If desired, and to maximize use of PCB real estate, the plurality of dice 31 may be supported by its associated solder bumps 37 to straddle the openings 20 and wire bonds 42 extending therethrough if the ball or bump connections are configured in a peripheral array. Dice 33 may similarly straddle openings 21 through which other dice (not shown) are wire bonded.

Figure 4:
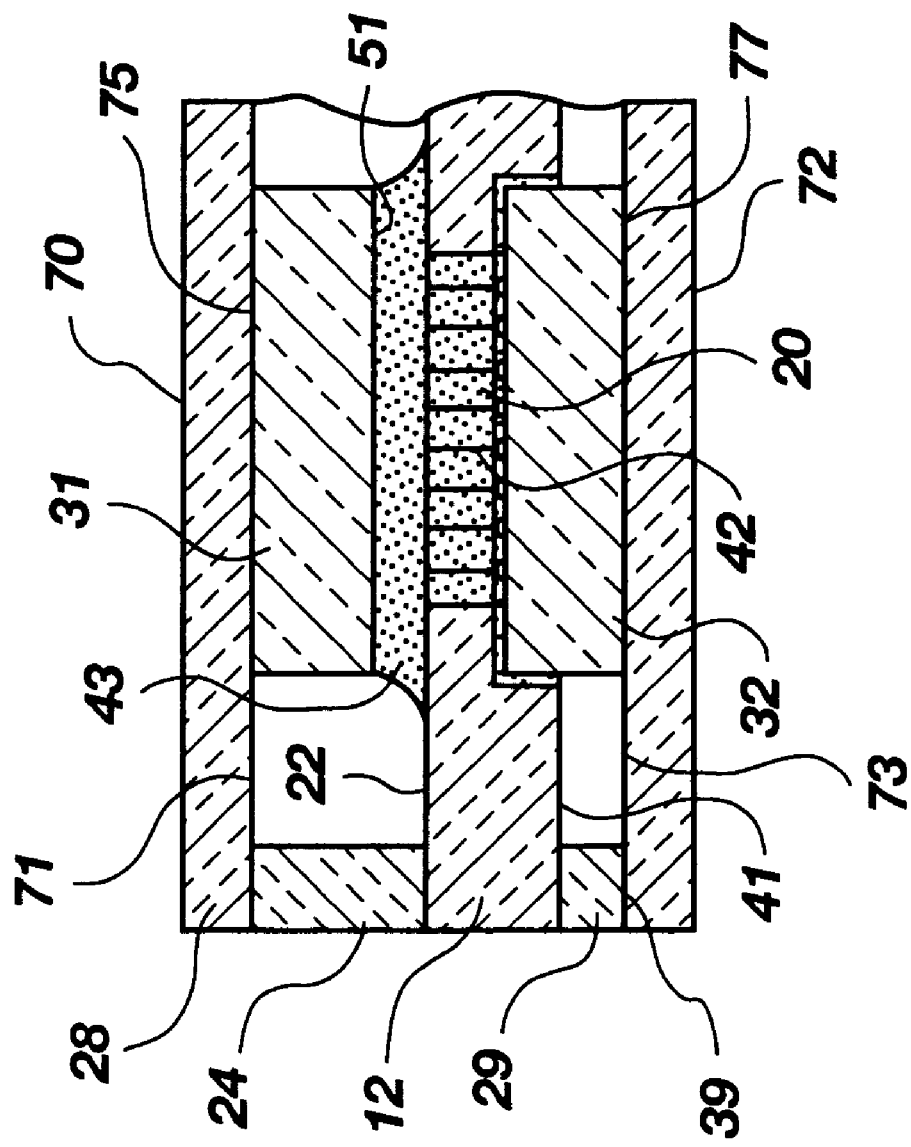
FIG. 4 is another partial, schematic cross-sectional view of the MCM shown in FIG. 3 showing top and bottom side walls and lids employed to enclose the dice and PCB.

FIG. 4 shows an alternate view of a portion of the MCM 10 shown in FIG. 3, taken 90° from the view in FIG. 3 and along the longitudinal center of a slot 20. The MCM 10 illustrated in FIG. 4 shows a completed MCM 10 with covers or lids 70 and 72 attached to walls 24 and 29, respectively. As noted previously, walls 24 and 29 may be integrally formed with PCB 12, or affixed after fabrication thereof. Further, the walls and their respective lids may be integrally or separately formed, and secured as a preformed unit to PCB 12. The inside surfaces 71 and 73 of the lids 70 and 72, respectively may contact and optionally be adhesively bonded by a heat-conductive adhesive to the non-active surfaces 75 and 77 of the dice 31 and 32, respectively, to provide a heat sink for the dice 31 and 32. If so, the top 28 of wall 24 should have substantially the same vertical or perpendicular height from the top surface 22 of the PCB 12 as the back side of dice 31. Similarly, the bottom 39 of the wall 29 should extend substantially the same distance from the bottom surface 41 of the PCB 12 as the back side of dice 32. The walls 24 and 29 and lids 70 and 72 may be comprised of a transparent or translucent, opaque, rigid, flexible, plastic, ceramic, silicone or any other suitable material or combination thereof known in the art. The walls, lids and PCB may be adhesively joined by any suitable adhesive as known in the art, the term adhesive including glass frit or other glass-based sealants. Such an arrangement according to the invention may be used (with suitable wall material and adhesives) to hermetically seal the semiconductor dice 32 and 31 relative to the top and bottom surfaces 22 and 41 of PCB 12, respectively.

Another aspect of the MCM 10 illustrated in FIG. 4 is the use of an insulative underfill with die 31. That is, before the lid 70 is attached, or particularly if no wall and lid is employed, the die 31 may be underfilled with a non-conductive epoxy or silicone gel 43. The underfill compound 43 helps to further stabilize and support the die 31 and its associated solder bumps 37. If the underfill compound 43 is flowed between the active surface 51 of the die 31 and the top surface 22 of the PCB 12 while the MCM 10 is oriented as shown in FIG. 4, the underfill compound 43 may flow into the opening or slot 20 and around the wire bonds 42. Further, a vacuum may be drawn below PCB 12 to assist in pulling underfill compound 43 into slots 20. If the presence of underfill compound 43 is not desired in the opening 20, however, the underfill compound 43 can be applied using injection probes similar to syringe needles while the MCM 10 of FIG. 4 is in an inverted position.

As shown in FIGS. 5 and 6, it is not necessary for practice of the invention to provide die recesses, such as recess 30, in the bottom surface 60 of the PCB 62 of an MCM according to the invention. In this preferred embodiment, the bottom surface 60 provides a substantially planar surface to which a plurality of semiconductor dice 32 may be attached. The die attach adhesive has been omitted for clarity in FIGS. 5 and 6. The wire bonds 64 are still shortened, compared to prior art MCMs, because an LOC arrangement is formed between the PCB 62 and the semiconductor dice 32. Unlike the previously described embodiment, however, a die 35 attached to the top surface 65 of the PCB 62 is positioned between, rather than over, the openings 67. The die 35 can either be flip-chip bonded at 70 (FIG. 5) or wire bonded 64 (FIG. 6) to conductive traces or pads on the top surface 65 of the PCB 62.

After all the dice 32 and 35 have been attached to the PCB 62, a simple method of encapsulating these components is to use a plurality of glob tops 66, as shown in FIGS. 5 and 6, made of a non-conductive epoxy, silicone gel or other suitable material known in the art to seal and stabilize the dice and wire bonds of the MCM.

Figure 7:
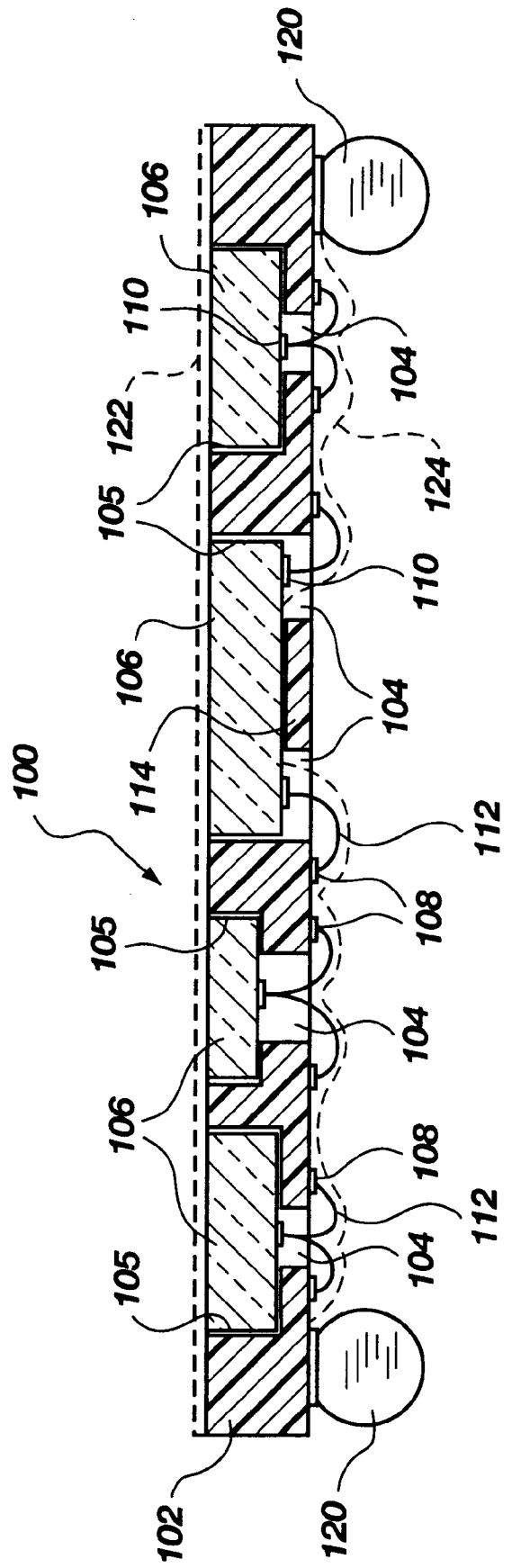
FIG. 7 is a partial, schematic cross-sectional view of a fourth embodiment of an MCM in accordance with the present invention wherein the carrier substrate is bumped for connection to higher-level packaging.

FIG. 7 depicts yet another preferred embodiment 100 of an MCM. MCM 100 includes a PCB 102 formed with a plurality of slots 104 opening into a plurality of recesses 105 to receive dice 106 and 106' of varying sizes, shapes and functions. PCB 102 includes conductive traces on at least the underside (as shown) thereof. These traces include a plurality of terminal pads or areas 108 to which the bond pads 110 of dice 106 and 106' are connected by intermediate conductive elements 112 preferably comprising wire bonds or TAB (flex circuit) connections or attachments. It should be noted that recesses 105 are of varying sizes, shapes and depths to enclose dice 106 and 106' completely within the exterior volume of PCB 102. Further, while three of the dice 106 include a central row or rows of bond pads 110, the second die 106' from the right carries two parallel rows of peripheral bond pads 110 and thus PCB 102 has been formed with two appropriately-spaced parallel slots 104 to align with bond pads 110 of die 106'. In this instance, the LOC arrangement for die 106' suspends die 106' from central rib or strut 114 of PCB 102 extending between and defining the two slots 104 associated with die 106'. PCB 102 includes a plurality of conductive bumps 120 to connect PCB 102 with dice 106 and 106' mounted thereon and electrically connected thereto to a mother board or other higher-level packaging. The bumps 120 may be arranged at the periphery of PCB 102, in a centralized array, or in any desired configuration permitted by required conductor runs, which may at least partially lie within PCB 102 as known in the art. It is contemplated that PCB 102 will be bumped prior to die attach and wire bonding or other electrical connection of the dice thereto, but it is also possible to preform the bumps 120 and attach them to PCB 102 after die attach and electrical connection. It will be appreciated that the PCB 102 will normally be inverted from the position shown in FIG. 7 for the electrical connection portion of the assembly operation, be it wire bonding or otherwise, after dice 106 and 106' are adhered in recesses 105 by one of the methods previously disclosed. Finally, a lid 122 as shown in broken lines may be secured to PCB 102 over recesses 105 to completely enclose the dice 106 and 106', and a conformal coating 124 as shown in broken lines may be applied to PCB 102 to physically protect, mechanically stabilize and mutually insulate the intermediate conductive elements 112.

In the exemplary embodiments, the LOC MCM as illustrated has a generally rectangular configuration having a plurality of substantially rectangular slots formed therein. Those skilled in the art, however, will appreciate that the size, shape, number and/or configuration thereof may vary according to design parameters without departing from the spirit and scope of the present invention. Moreover, although this invention has been described with respect to a PCB, the term as used herein as previously noted is applicable to a wide variety of carrier substrates and the invention is not limited to substrates of any particular material. Moreover, those skilled in the art will appreciate that there may be other ways of attaching and encapsulating the semiconductor dice to the PCB including modifications and combinations of the means described herein, and further including electrical connection of either the upper or lower dice by metal traces carried on flexible dielectric films, also called TAB (tape automated bonding) in the art, the elements identified herein as wire bonds being equally suitable as TAB connections. It will also be appreciated by those of ordinary skill in the art that one or more features of one of the illustrated embodiments may be combined with one or more features from another to form yet another combination within the scope of the invention as described and claimed herein. Thus, while certain representative embodiments and details have been shown for purposes of illustrating the invention, it will be apparent to those skilled in the art that various changes in the invention disclosed herein may be made without departing from the scope of the invention, which is defined in the appended claims.

What is claimed is:

1. A multi-chip module, comprising:
   a carrier substrate including at least one opening defined therethrough bounded by a periphery and a surface including a plurality of conductive areas thereon, at least one conductive area lying laterally adjacent said at least one opening;
   at least one semiconductor die including a plurality of bond pads, said at least one semiconductor die secured to another surface of said substrate with said plurality of bond pads exposed through said at least one opening;
   at least one discrete, elongated intermediate conductive element connected to at least one of said plurality of conductive areas and to at least one of said plurality of bond pads, extending through said at least one opening and spaced apart from said periphery; and
   at least one other semiconductor die including a plurality of bond pads adjacent said surface and connected to at least another of said plurality of conductive areas.

2. The multi-chip module of claim 1, wherein said at least one semiconductor die is partially disposed over said at least one opening.

3. The multi-chip module of claim 1, wherein said at least one other semiconductor die is laterally adjacent said at least one opening.

4. The multi-chip module of claim 1, wherein said at least one semiconductor die is electrically connected to said at least one of said plurality of conductive areas by an intermediate conductive element comprising a TAB connection.

5. The multi-chip module of claim 1, wherein said at least one other semiconductor die is flip-chip bonded to at least one of said plurality of conductive areas.

6. The multi-chip module of claim 1, wherein at least one of said plurality of conductive areas lies over at least a portion of said at least one semiconductor die.

7. The multi-chip module of claim 6, wherein said at least one intermediate conductive element is selected from the group comprising bond wires and TAB connections.

8. The multi-chip module of claim 1, wherein said another surface defines at least one recess sized and shaped to receive at least a portion of said at least one semiconductor die and said at least one semiconductor die is disposed at least partially therein.

9. The multi-chip module of claim 1, further including an adhesive bond between said at least one semiconductor die and said carrier substrate.

10. The multi-chip module of claim 1, wherein said plurality of conductive areas is in electrical communication with edge-connects at a periphery of said carrier substrate.

11. The multi-chip module of claim 1, wherein said at least one opening comprises a plurality of elongated, mutually parallel openings.

12. The multi-chip module of claim 11, further including at least one other elongated opening oriented in non-parallel relationship to said plurality of mutually parallel openings.

13. The multi-chip module of claim 1, wherein said at least one other semiconductor die is positioned at least partially over said at least one opening.

14. The multi-chip module of claim 1, further including an underfill compound disposed between said at least one other die and said surface.

15. The multi-chip module of claim 14, wherein said underfill compound extends at least partially into said at least one opening.

16. The multi-chip module of claim 14, wherein said underfill compound substantially envelops said at least one intermediate conductive element.

17. A semiconductor die assembly, comprising:
    a carrier substrate having a plurality of slots therethrough and a plurality of conductors on a first side of said carrier substantially laterally adjacent said plurality of slots, said conductors in electrical communication with a plurality of conductive elements transversely projecting from said first side for electrically connecting said carrier substrate to a higher-level package;
    at least one semiconductor die secured to said carrier substrate adjacent a second side thereof and having a plurality of bond pads exposed through said plurality of slots; and
    at least one individual, elongated intermediate conductive element connected to at least one of said plurality of bond pads, extending through said plurality of slots and spaced apart from a periphery thereof.

18. The semiconductor die assembly of claim 17, further including at least one recess in said second side.

19. The semiconductor die assembly of claim 18, wherein said at least one recess communicates with said at plurality of slots.

20. The semiconductor die assembly of claim 18, wherein said at least one recess is configured to receive at least a portion of said at least one semiconductor die.

* * * * *

UNITED STATES PATENT AND TRADEMARK OFFICE
CERTIFICATE OF CORRECTION

PATENT NO. : 5,936,305  
DATED : August 10, 1999  
INVENTOR(S) : Salman Akram

Page 1 of 1

It is certified that error appears in the above-identified patent and that said Letters Patent is hereby corrected as shown below:

Title page, "Abstract",  
Line 5 of text, change "flip chip" to -- flip-chip --;

Drawings,  
Fig. 7, change reference numeral "106" (second from left) to -- 106' --;

Column 1,  
Line 62, change "flip chip" to -- flip-chip --;

Column 3,  
Line 13, after "are" insert -- , --;

Column 5,  
Line 19, delete "a slot" and insert -- an opening -- therefor;  
Line 25, delete "," after "formed";  
Line 27, after "respectively" insert -- , --;  
Line 59, delete "slots" and insert -- openings -- therefor;

Column 8,  
Claim 17,  
Line 36, after "carrier" insert -- substrate --; and  
Claim 19,  
Line 52, delete "at" (second occurrence) before "plurality".

Signed and Sealed this

Twenty-first Day of August, 2001

Attest:

*Nicholas P. Godici*

NICHOLAS P. GODICI  
*Attesting Officer*     *Acting Director of the United States Patent and Trademark Office*